United States Patent
Kobayakawa

(10) Patent No.: US 8,541,808 B2
(45) Date of Patent: *Sep. 24, 2013

(54) SEMICONDUCTOR LIGHT-EMITTING DEVICE

(75) Inventor: Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/414,294

(22) Filed: Mar. 7, 2012

(65) Prior Publication Data

US 2012/0168812 A1   Jul. 5, 2012

Related U.S. Application Data

(60) Continuation of application No. 12/890,964, filed on Sep. 27, 2010, now Pat. No. 8,154,045, which is a division of application No. 12/079,760, filed on Mar. 28, 2008, now Pat. No. 7,825,426.

(30) Foreign Application Priority Data

Mar. 30, 2007   (JP) ................................. 2007-092879

(51) Int. Cl.
   *H01L 33/00*      (2010.01)

(52) U.S. Cl.
   USPC ............. 257/99; 257/690; 257/692; 257/735; 257/784; 257/E33.056; 257/E33.058; 257/E33.066

(58) Field of Classification Search
   USPC ............ 257/99, 690, 692, 735, 784, E33.056, 257/E33.058, E33.066
   See application file for complete search history.

(56) References Cited

U.S. PATENT DOCUMENTS

| | | | |
|---|---|---|---|
| 5,062,115 A | | 10/1991 | Thornton |
| 5,719,663 A | * | 2/1998 | Hirai et al. .................. 356/3.03 |
| 6,501,156 B1 | | 12/2002 | Nakanishi et al. |
| 7,436,002 B2 | | 10/2008 | Brunner et al. |
| 7,655,958 B2 | * | 2/2010 | Sanmyo .......................... 257/99 |
| 2004/0159850 A1 | | 8/2004 | Takenaka |
| 2005/0269587 A1 | | 12/2005 | Loh et al. |
| 2005/0280017 A1 | | 12/2005 | Oshio et al. |
| 2006/0170083 A1 | | 8/2006 | Kim et al. |
| 2008/0121921 A1 | | 5/2008 | Loh et al. |

FOREIGN PATENT DOCUMENTS

| | | |
|---|---|---|
| CN | 1288261 | 3/2001 |
| CN | 1822402 | 8/2006 |
| JP | 2005-353914 | 12/2005 |
| JP | 2007-5378 | 1/2007 |
| JP | 2007-59677 | 3/2007 |
| JP | 2007-67443 | 3/2007 |
| WO | WO 03/005458 | 1/2003 |

* cited by examiner

*Primary Examiner* — Kenneth Parker
*Assistant Examiner* — Dale E Page
(74) *Attorney, Agent, or Firm* — Hamre, Schumann, Mueller & Larson, P.C.

(57) ABSTRACT

A semiconductor light-emitting device includes a lead frame, a semiconductor light-emitting element mounted on the top surface of the bonding region, and a case covering part of the lead frame. The bottom surface of the bonding region is exposed to the outside of the case. The lead frame includes a thin extension extending from the bonding region and having a top surface which is flush with the top surface of the bonding region. The thin extension has a bottom surface which is offset from the bottom surface of the bonding region toward the top surface of the bonding region.

14 Claims, 3 Drawing Sheets

SEMICONDUCTOR LIGHT-EMITTING DEVICE

This application is a Continuation of application Ser. No. 12/890,964, filed Sep. 27, 2010, which is a Division of application Ser. No. 12/079,760, filed Mar. 28, 2008, which applications are incorporated herein by reference.

BACKGROUND OF THE INVENTION

1. Field of the Invention

The present invention relates to a semiconductor light-emitting device provided with a semiconductor light-emitting element.

2. Description of the Related Art

FIGS. 6 and 7 illustrate an example of conventional semiconductor light-emitting device (see JP-A-2005-353914, for example). The illustrated semiconductor light-emitting device X includes a lead frame 91, an LED chip 92, a case 93, and a transparent resin 94. The lead frame 91 includes two strip portions, i.e., a relatively long portion 91a and a relatively short portion 91b, as seen from FIG. 6. These two portions, having the same width as seen from FIG. 7, are fitted into a lower space in the case 93 in a manner such that the bottom surface of the lead frame 91 is exposed out of the case 93. The LED chip 92 serves as a light source of the semiconductor light-emitting device X, and is bonded to the longer strip portion 91a of the lead frame 91. The LED chip 92 is connected to the shorter strip portion 91b of the lead frame 91 via a wire 95. The light-emitting device X may be mounted on a printed circuit board, for example.

In order to obtain stronger light emission from the semiconductor light-emitting device X, it is required to apply greater electrical power to the LED chip 92. Inevitably, the amount of heat generated by the LED chip 92 is increased, and for maintaining the proper light emission, the heat should be conducted from the longer strip portion 91a to the circuit board. One way to facilitate the heat conduction is to broaden the strip portion 91a (hence the lead frame 91) to which the LED chip 92 is attached.

While the width of the longer strip portion 91a is to be increased, the overall size of the case 93 may be unchanged so that the light-emitting device X is kept compact. In this case, the side walls of the case 93 need to be made thinner to permit the size increase of the longer strip portion 91a. This configuration, however, will weaken the frame-holding force of the case 93, which may allow the lead frame 91 to drop off from the case 93.

SUMMARY OF THE INVENTION

The present invention has been proposed under above-described circumstances, and thus an object of the present invention is to provide a semiconductor light-emitting device that is compact and capable of emitting bright light.

According to the present invention, there is provided a semiconductor light-emitting device comprising: a lead frame including a bonding region having a top surface and a bottom surface; a semiconductor light-emitting element mounted on the top surface of the bonding region; and a case covering part of the lead frame. The bottom surface of the bonding region is exposed to an outside of the case. The lead frame includes a thin extension extending from the bonding region and having a top surface and a bottom surface. The top surface of the thin extension is flush with the top surface of the bonding region, while the bottom surface of the thin extension is offset from the bottom surface of the bonding region toward the top surface of the bonding region.

Preferably, the semiconductor light-emitting device of the present invention may further comprise a thick extension extending from the bonding region and having a top surface and a bottom surface. The thick extension is arranged adjacent to the thin extension and is the same in thickness as the bonding region. The bottom surface of the thick extension is exposed to the outside of the case.

Other features and advantages will be apparent from the following description with reference to the accompanying drawings.

DETAILED DESCRIPTION OF THE PREFERRED EMBODIMENTS

Preferred embodiments of the present invention will be described below with reference to the accompanying drawings.

Figure 1:
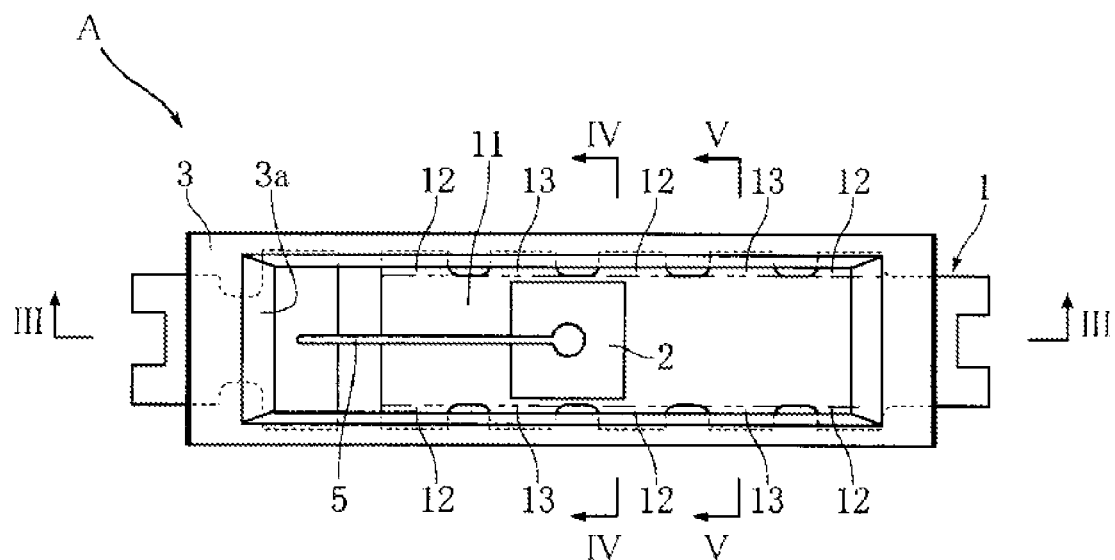
FIG. 1 is a plan view illustrating the principal portions of a semiconductor light-emitting device according to the present invention.

FIGS. 1-5 illustrate a semiconductor light-emitting device according to the present invention. The semiconductor light-emitting device A includes a lead frame 1, a light-emitting diode (LED) chip 2, a case 3, and a protection resin 4 that allows the passage of light emitted from the LED chip 2. The light-emitting device A is a small rectangular parallelepiped having a length of about 4 mm, a width of about 1 mm, and a height of about 0.6 mm. In FIG. 1, for convenience of explanation, the protection resin 4 is not shown.

Figure 2:
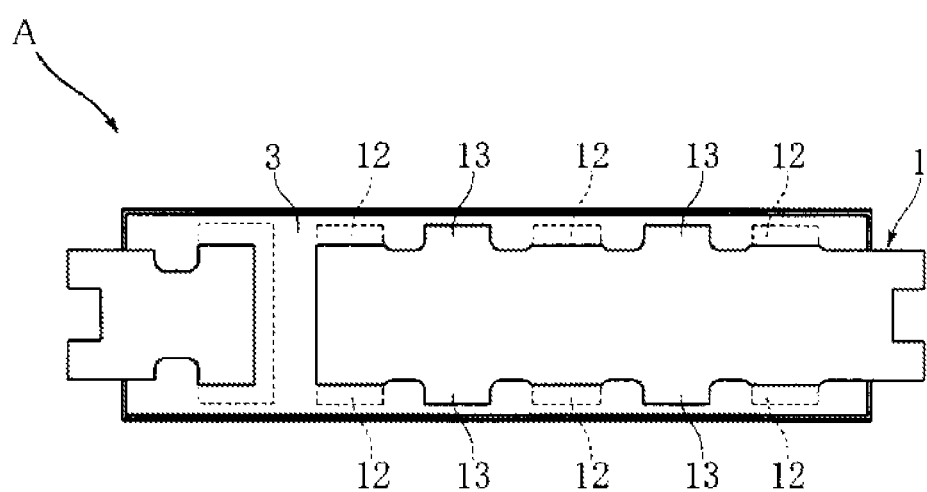
FIG. 2 is a bottom view illustrating the semiconductor light-emitting device shown in FIG. 1.

The lead frame 1 is made of Cu, Ni, or an alloy containing Cu and/or Ni. As shown in FIG. 2, the lead frame 1 is exposed out of the case 3 at its bottom surface, and is divided into a longer primary portion and a shorter secondary portion. The primary portion includes a bonding region 11, a plurality of thin extensions 12, and a plurality of thick extensions 13. In FIG. 1, the boundary between the bonding region 11 and the extensions 12, 13 is indicated by double-dot broken lines.

Figure 4:
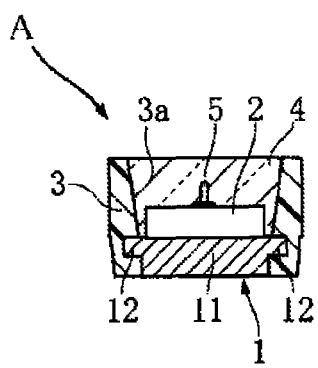
FIG. 4 is a sectional view taken along lines IV-IV in FIG. 1.

The bonding region 11 is a strip-shaped region on part of which the LED chip 2 is mounted. Each of the thin extensions 12 extends out from the bonding region 11, and has a thickness which is about half the thickness of the bonding region 11, for example. As shown in FIG. 4, the top surfaces of the thin extensions 12 are flush with the top surface of the bonding region 11. The bottom surfaces of the thin extensions 12 are positioned higher than the bottom surface of the bonding potion 11, as viewed vertically in FIG. 4 (in other words, the bottom surfaces of the thin extensions 12 are offset toward the top surface of the bonding region 11 from the bottom surface of the bonding region 11). The bottom surfaces of the thin extensions 12 are covered by the case 3.

Figure 5:
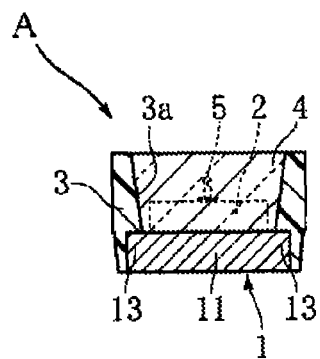
FIG. 5 is a sectional view taken along lines V-V in FIG. 1.
Figure 6:
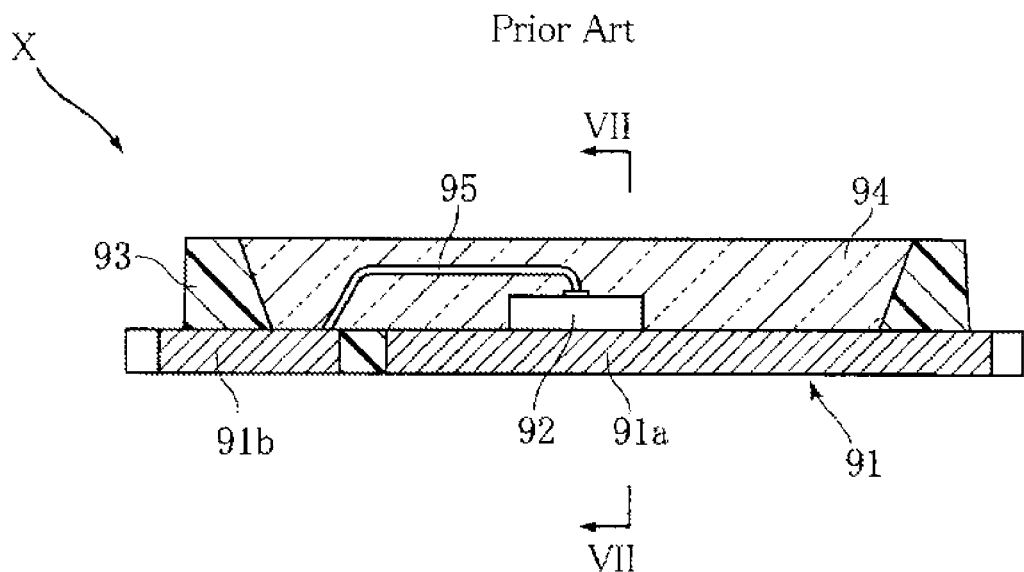
FIG. 6 is a sectional view illustrating a conventional semiconductor light-emitting device.
Figure 7:
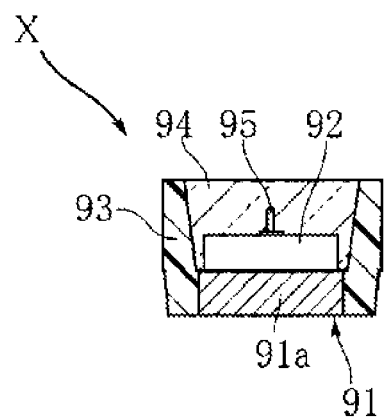
FIG. 7 is a sectional view taken along lines VII-VII in FIG. 6.

As shown in FIG. 5, each of the thick extensions 13 extends out from the bonding region 11, and has a thickness which is substantially the same as the thickness of the bonding region 11. The top surfaces of the thick extensions 13 are flush with the top surface of the bonding region 11, and the bottom surfaces of the thick extensions 13 (which are flush with the bottom surface of the bonding region 11) are exposed to the outside of the case 3. As shown in FIGS. 1 and 2, the thin extensions 12 and the thick extensions 13 are arranged alternatively in the longitudinal direction of the lead frame 1.

The LED chip 2 as a light source of the light-emitting device A is configured to emit light of a predetermined wavelength. The LED chip 2 is made of a semiconductor material such as GaN, for example, and emits blue light, green light, or red light by the recombination of electrons and holes at an active layer sandwiched by an n-type semiconductor layer and a p-type semiconductor layer. The LED chip 2 is connected to the shorter portion of the lead frame 1 via a wire 5.

Figure 3:
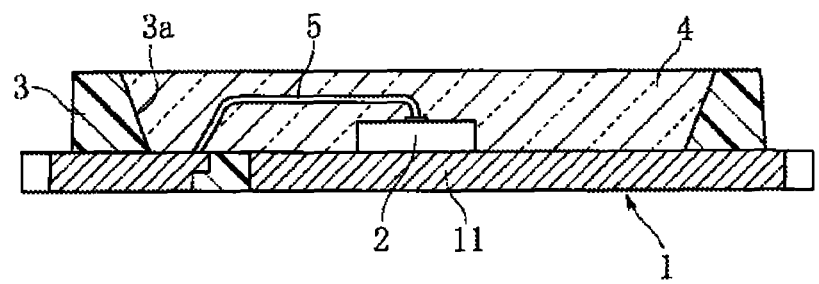
FIG. 3 is a sectional view taken along lines III-III in FIG. 1.

The case 3 is made of a white resin, for example, and is a generally rectangular frame. As shown in FIGS. 3-5, the inner surfaces of the case 3 serve as a reflector 3a that tapers downward. The reflector 3a upwardly reflects light which is emitted laterally from the LED chip 2. As shown in FIG. 4, the case 3 is held in unreleasable engagement with the thin extensions 12. Further, as shown in FIG. 2, the case 3 is in mesh with the thin extensions 12 and the thick extensions 13.

The protection resin 4 is made of a transparent or transparent epoxy resin, for example, filled in a space defined by the case 3. The protection resin 4 covers the LED chip 2, and while protecting the LED chip 2.

Next, the functions of the semiconductor light device A will be described below.

As described above, the case 3 is held in unreleasable engagement with the thin extensions 12. Thus, the lead frame 1 is reliably held by the case 3, to be prevented from dropping off from the case 3. As a result, though the light-emitting device A has a very small width (about 1 mm), the lead frame 1 is exposed out of the case 3 in a relatively large area, as seen from FIG. 2. Therefore, heat can be efficiently conducted from the LED chip 2 to a printed circuit board, for example, which contributes to attaining light emission of desired intensity.

As described above, the thin extensions 12 and the thick extensions 13 are arranged to alternate with each other, and the bottom surfaces of the thick extensions 13 are exposed to the outside of the case 3, as shown in FIG. 2. In this manner, the exposed area of the lead frame 1 can be increased. Advantageously, this facilitates the heat dissipation from the led chip 2.

The invention claimed is:

1. A semiconductor device comprising:
a first lead frame including a bonding region provided with an upper surface and a lower surface;
a semiconductor element mounted on the upper surface of the bonding region; and
a case covering part of the first lead frame;
wherein the first lead frame includes thin extensions extending from the bonding region in a width direction of the first lead frame, each of the thin extensions being smaller in thickness than the bonding region, and
the lower surface of the bonding region is exposed from a bottom surface of the case.

2. The semiconductor device according to claim 1, wherein the first lead frame is formed with a first recess located between adjacent ones of the thin extensions, the first recess being indented in the width direction relative to the adjacent ones of the thin extensions.

3. The semiconductor device according to claim 1, wherein the first lead frame includes a thick extension greater in thickness than the thin extensions, the thick extension being located between adjacent ones of the thin extensions.

4. The semiconductor device according to claim 1, wherein the thin extensions are disposed at regular intervals.

5. The semiconductor device according to claim 1, further comprising:
a second lead frame including a wire bonding region; and
a wire for connecting the wire bonding region and the semiconductor element to each other;
wherein the case covers the second lead frame in a manner allowing the wire bonding region to be exposed to an outside of the case,
wherein the second lead frame includes a second thin extension extending from the wire bonding region, the second thin extension being smaller in thickness than the wire bonding region.

6. The semiconductor device according to claim 5, wherein the second lead frame includes a terminal at an end thereof opposite to the first lead frame, and the second lead frame is formed with a second recess located between the terminal and the second thin extension, the second recess being indented in the width direction relative to the second thin extension.

7. The semiconductor device according to claim 5, wherein the width direction is perpendicular to a separation direction in which the first lead frame and the second lead frame are spaced apart from each other.

8. The semiconductor device according to claim 7, wherein the thin extensions are aligned in the separation direction.

9. The semiconductor device according to claim 1, wherein the bottom surface of the case and the lower surface of the bonding region are flush with each other.

10. The semiconductor device according to claim 1, wherein each of the thin extensions includes an end that is spaced from the bonding region in the width direction and embedded in the case.

11. The semiconductor device according to claim 2, wherein the first lead frame includes a terminal protruding from the case in a separation direction that is perpendicular to the width direction, the first lead frame is formed with an additional recess facing the first recess in the width direction, and a distance between the first recess and the additional recess is equal to a size of the terminal of the first lead frame in the width direction.

12. The semiconductor device according to claim 1, wherein each of the thin extensions includes a lower portion parallel to the upper surface of the bonding region.

13. The semiconductor device according to claim 1, wherein the first lead frame includes an upright portion connected to both the lower surface of the bonding region and one of the thin extensions, the upright portion being perpendicular to the upper surface of the bonding region.

14. The semiconductor device according to claim 2, wherein the first recess corresponds in location to the semiconductor element along a longitudinal direction of the first lead frame.

* * * * *